(12) United States Patent
Lewis (10) Patent No.: US 8,174,284 B1
(45) Date of Patent: *May 8, 2012

(54) REPAIRABLE IO IN AN INTEGRATED CIRCUIT

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/014,990

(22) Filed: Jan. 27, 2011

Related U.S. Application Data (63) Continuation of application No. 12/717,022, filed on Mar. 3, 2010, now Pat. No. 7,902,855.

(51) Int. Cl.
*H03K 19/003* (2006.01)

(52) U.S. Cl. .......................................... 326/10; 326/38

(58) Field of Classification Search ................ 326/9, 10, 326/37–41, 46
See application file for complete search history.

(56) References Cited

U.S. PATENT DOCUMENTS

| | | | |
|---|---|---|---|
| 4,899,067 A | 2/1990 | So et al. | |
| 5,260,611 A | 11/1993 | Cliff et al. | |
| 5,369,314 A | 11/1994 | Patel et al. | |
| 5,434,514 A | 7/1995 | Cliff et al. | |
| 5,592,102 A | 1/1997 | Lane et al. | |
| 5,926,036 A | 7/1999 | Cliff et al. | |
| 6,034,536 A | 3/2000 | McClintock et al. | |
| 6,107,820 A | 8/2000 | Jefferson et al. | |
| 6,167,558 A | 12/2000 | Trimberger | |
| 6,201,404 B1 | 3/2001 | Reddy et al. | |
| 6,344,755 B1 | 2/2002 | Reddy et al. | |
| 6,600,337 B2 | 7/2003 | Nguyen et al. | |
| 6,605,962 B2 | 8/2003 | Lee et al. | |

(Continued)

FOREIGN PATENT DOCUMENTS

JP 2002-140895 A 5/2002

(Continued)

OTHER PUBLICATIONS

Betz, V. et al., Architecture and CAD for Deep-Submicron FPGAs, Mar. 1999, pp. 11-18 (Chapter 2.1), 63-103 (Chapter 4), 105-126 (Chapter 5), and 151-190 (Chapter 7), Kluwer Academic Publishers.

(Continued)

*Primary Examiner* — Don Le (74) *Attorney, Agent, or Firm* — Mauriel Kapouytian & Treffert LLP; Michael Mauriel (57) ABSTRACT

Methods and structures for implementing repairable input/output (IO) circuitry in an integrated circuit (IC) are disclosed. One embodiment of the present invention includes repairable IO circuitry along a right, left, or inner column of an IC. Another embodiment includes repairable IO circuitry along a top, bottom, or inner row of an IC. In one embodiment, normal and redundant mode routing is provided between IO buffer circuits and IO register circuits. In another embodiment, normal and redundant mode routing is also provided between IO register circuits and routing to core regions of the IC. One embodiment provides normal and redundant mode routing between two or more IO registers that may span more than one row and/or more than one IO block. One embodiment provides normal and redundant mode routing for different types of IO registers. In some embodiments, redundant mode IO connections shift along with redundant mode connections in a core logic region of the IC. In other embodiments, redundant mode IO connections operate to repair IO circuitry independently of any redundancy scheme in the IC's core regions.

13 Claims, 7 Drawing Sheets

Row r6

U.S. PATENT DOCUMENTS

| | | | |
|---|---|---|---|
| 6,630,842 B1 | 10/2003 | Lewis et al. | |
| 6,653,862 B2 | 11/2003 | Johnson et al. | |
| 6,965,249 B2 * | 11/2005 | Lane et al. | 326/10 |
| 7,180,324 B2 | 2/2007 | Chan et al. | |
| 7,215,140 B1 | 5/2007 | Saini et al. | |
| 7,414,429 B1 * | 8/2008 | Kim et al. | 326/41 |
| 7,508,321 B2 | 3/2009 | Lewis et al. | |
| 7,644,386 B1 | 1/2010 | Chan et al. | |
| 2003/0026132 A1 | 2/2003 | Hill | |

FOREIGN PATENT DOCUMENTS

| | | |
|---|---|---|
| JP | 2004-192792 A | 7/2004 |
| JP | 2007-096918 A | 4/2007 |
| KR | 10-0289806 B1 | 5/2001 |
| WO | PCT/US2011/026708 | 11/2011 |

OTHER PUBLICATIONS

Chang, S. et al., "Layout Driven Logic Synthesis for FPGAs," publisher and date unknown, pp. 1-6.

Hatori, F. et al., "Introducing Redundancy in Field Programmable Gate Arrays," IEEE Custom Integrated Circuits Conference, 1993, 7.1.1-7.1.4.

Katz, R. et al., "SEU Hardening of Field Programmable Gate Arrays (FPGAS) for Space Applications and Device Characterization," IEEE Transactions on Nuclear Science, Dec. 1994, vol. 41., No. 6., pp. 2179-2186.

Kelly, J. L. et al., "Defect Tolerent SRAM based FPGAs," IEEE, 1994, pp. 479-482.

* cited by examiner

Column c6

REPAIRABLE IO IN AN INTEGRATED CIRCUIT

CROSS REFERENCE TO RELATED APPLICATIONS

This application is a continuation of U.S. application Ser. No. 12/717,022, filed Mar. 3, 2010, hereby incorporated by reference.

BACKGROUND

This invention relates generally to the area of repairable integrated circuits.

Integrated circuits (ICs) that are configurable to use redundant circuitry to achieve repair of the IC are known. Such configuration may be accomplished via reprogramming configuration elements on the IC. Programmable elements may include dynamic or static RAM, flip-flops, electronically erasable programmable read-only memory (EEPROM) cells, flash, fuse, anti-fuse programmable connections, or other memory elements. Configuration may also be accomplished via one or more externally generated signals received by the IC during operation of the IC. Data represented by such signals may or may not be stored on the IC during operation of the IC. However, configuration for repairing an IC is often accomplished at the factory via one-time programmable elements such as fuses that enable redundant circuitry.

A specific example of an IC that supports configuration is a programmable logic device (PLD). PLDs (also referred to as complex PLDs, programmable array logic, programmable logic arrays, field PLAs, erasable PLDs, electrically erasable PLDs, logic cell arrays, field programmable gate arrays, or by other names) provide the advantages of fixed ICs with the flexibility of custom ICs. PLDs have configuration elements (i.e., programmable elements) that may be programmed or reprogrammed. Placing new data into the configuration elements programs or reprograms the PLD's logic functions and associated routing pathways.

In some examples of prior PLDs with redundant circuitry, logic circuits in the core of the device are organized into rows of circuitry blocks sometimes referred to as logic array blocks ("LABs"; also referred to by other names, e.g., "configurable logic blocks," or "CLBs"). In some prior implementations, an extra or "redundant" row of core circuitry is provided in a repairable region and if circuitry in one row is defective, routing selection circuitry is provided and programmed such that rows are shifted down from a broken row to the redundant row so that the repairable region of the device can operate as it would have had no rows been defective.

Past implementations have typically permitted repair of defective circuitry in the core areas of the device but not of defective circuitry in the peripheral areas that include input/output circuitry (IOs). However, as IOs become more complex and take up a greater portion of an IC, methods and structures for effecting repair of IO circuitry are needed.

SUMMARY

One embodiment of the present invention includes repairable input/output (IO) circuitry along a right, left, or inner column of an integrated circuit (IC). Another embodiment includes repairable IO circuitry along a top, bottom, or inner row of an IC. In one embodiment, normal and redundant mode routing is provided between IO buffer circuits and IO register circuits. In another embodiment, normal and redundant mode routing is also provided between IO register circuits and routing to core regions of the IC. One embodiment provides normal and redundant mode routing between two or more IO registers that may span more than one row and/or more than one IO block. One embodiment provides normal and redundant mode routing for different types of IO registers. In some embodiments, redundant mode IO connections shift along with redundant mode connections in a core logic region of the IC. In other embodiments, redundant mode IO connections operate to repair IO circuitry independently of any redundancy scheme in the IC's core regions. Various aspects of these and other embodiments are further described herein.

BRIEF DESCRIPTION OF THE DRAWINGS

For purposes of illustration only, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
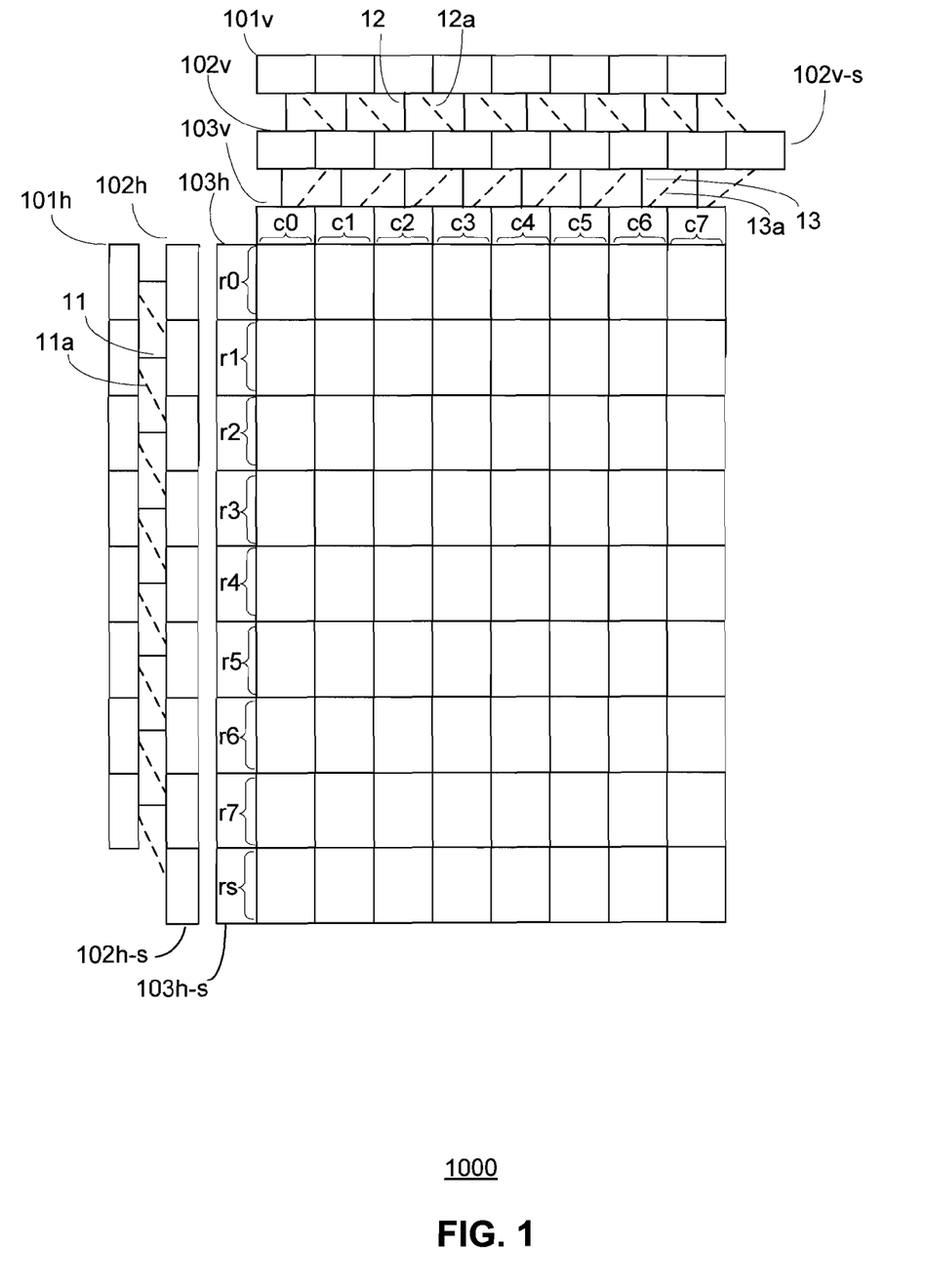
FIG. 1 is a high level diagram illustrating an integrated circuit ("IC") portion 1000 including repairable input/output ("IO") circuitry in accordance with two embodiments of the present invention.

FIG. 1 is a high level diagram illustrating an integrated circuit ("IC") portion 1000 including repairable input/output ("IO") circuitry in accordance with two embodiments of the present invention. The first embodiment relates to repairable horizontal IO circuitry (along the left periphery of portion 1000) and the second embodiment relates to repairable vertical IO circuitry (along the top periphery of portion 1000). As will be made clearer herein, "horizontal" and "vertical" are simply labels to distinguish different orientations of routing and on the IC as well as IO circuitry coupled to that routing.

IC portion 1000 includes a plurality of horizontal IO buffer circuit blocks 101h, a plurality of horizontal IO register circuit blocks 102h, a spare horizontal IO register circuit block 102h-s, normal mode routing 11 and redundant mode routing 11a (redundant mode routing referenced here and elsewhere by dashed lines). IC portion 1000 further includes a plurality of vertical IO buffer circuit blocks 101v, a plurality of vertical IO register circuit blocks 102v, a spare vertical IO register circuit block 102v-s, normal mode routing 12 and 13 and redundant mode routing 12a and 13a.

It will be appreciated by those skilled in the art that although the IO circuitry illustrated herein is shown on outer regions of an IC portion, in alternative embodiments, IO circuitry might be arranged in inner portions of the IC. For example, an inner row(s) and/or inner column(s) of IO circuitry might divide the IC into multiple core logic regions adjacent to the inner IO regions. Such an IC might or might not also include IO regions on the periphery of the IC.

The core of IC portion 1000 is arranged consistently with a row based redundancy scheme. Specifically, circuitry is arranged in rows including rows r0, r1, r2, r3, r4, r5, r6, r7, and spare row rs. Such a scheme allows for repair in the following manner: In a "normal mode" of the IC portion, only rows r0-r7 are utilized. ("Normal mode" as used herein is simply a label to refer to operation of an IC portion for which repair was not needed and spare circuitry is not utilized). However, if circuitry in one of the rows is defective, the IC portion can be configured to operate in a "redundant mode" and routing to rows is shifted from a bad row to the spare row such that each shifted row as well as the spare row is used in place of the row above it. Each IO register circuit block 102h is coupled to route signals to a routing interface 103h corresponding to a particular row in the IC portion's core. Spare IO circuitry block 102h-s is coupled to route signals to a spare routing interface 103h-s corresponding to spare row rs. If any of the IO register circuit blocks 102h is defective, that block and a row associated with the block can be bypassed. Specifically, selection circuitry (illustrated and described in the context of FIG. 2) can be configured to utilize redundant mode routing 11a (redundant mode routing illustrated here and elsewhere with dashed lines) from the row associated with the defective IO circuitry block 102h to the spare row rs associated with spare IO circuitry block 102h-s, thus allowing for repair of defective horizontal IO circuitry.

In a second embodiment illustrated in FIG. 1, IC portion 1000 also allows for repair of defective vertical IO circuitry. IO register circuitry blocks 102v along a top periphery of IC portion 1000 send and receive signals between IO buffer circuit blocks 101v and vertical routing interfaces 103v. Vertical routing interfaces 103v are associated with columns c0, c1, c2, c3, c4, c5, c6, and c7 of circuitry in IC portion 1000's core. A spare IO register block 102v-s is provided. If one of the IO register blocks 102v is defective, blocks 102v can be shifted to the right from a defective block to spare block 102v-s. In such a mode, from just to the right of a defective block to the spare block, redundant mode routing 12a is selected to route signals between an IO buffer 101v and an IO register block 102v and redundant mode routing 13a is selected to rout signals between an IO register block 102v and a vertical routing interface 103v. Alternate routing 13a allows IO register circuit blocks to shift to the right even though columns of circuitry within portion 1000 and associated vertical routing interfaces 103v are not shifted.

Figure 2:
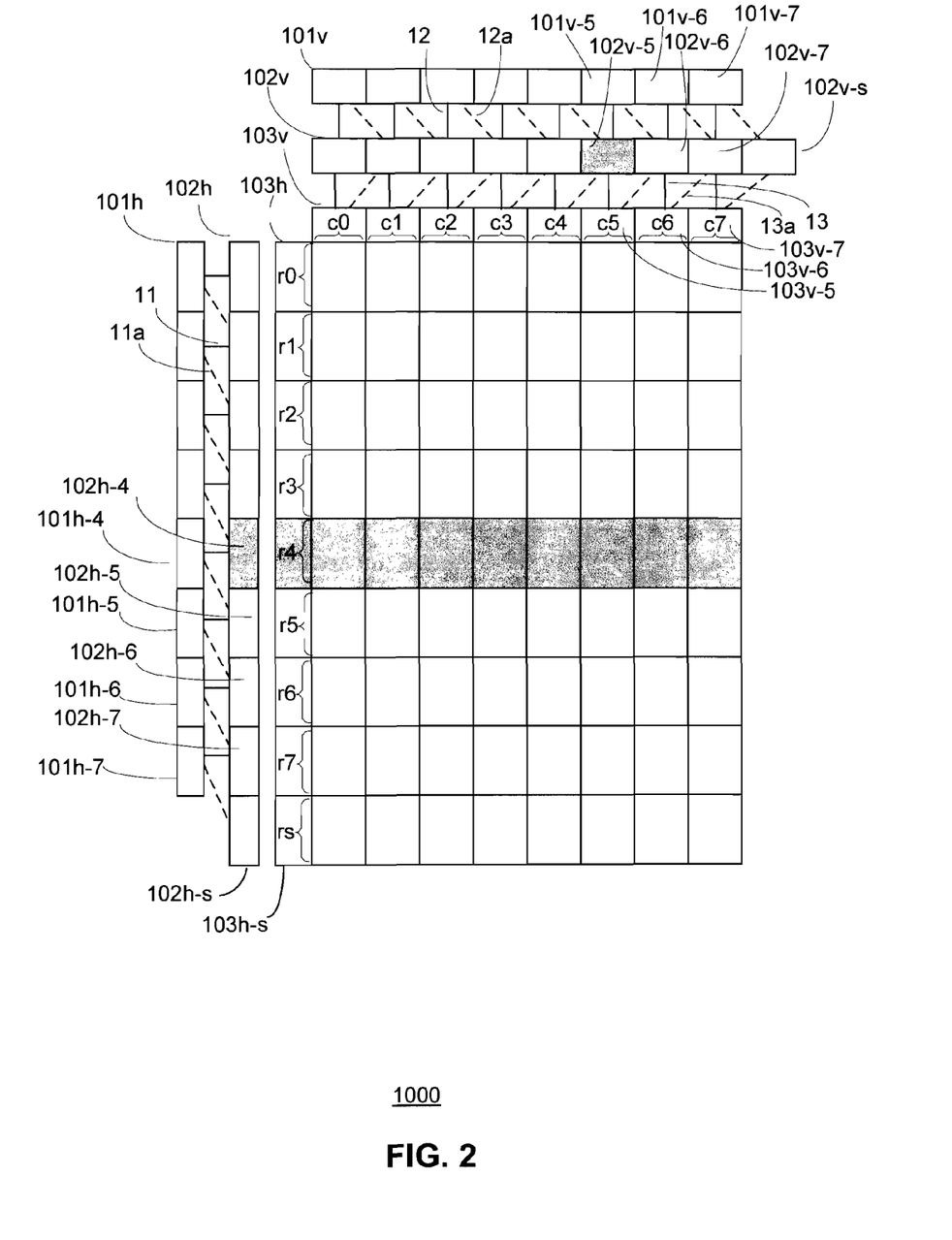
FIG. 2 illustrates two different repair scenarios that can be implemented by IC portion 1000 of FIG. 1.

FIG. 2 illustrates two different repair scenarios that can be implemented by IC portion 1000 of FIG. 1. In the illustrated embodiment, circuitry in horizontal IO register block 102h-4 is defective. Register block 102h-4 is coupled to a horizontal routing interface 103h associated with row r4. Row based redundancy is therefore engaged from row r4 to the spare row. Redundant mode routing 11a from the defective row to the spare row is selected to route signals between buffer block 101h-4 and register block 101h-5; between buffer block 101h-5 and register block 101h-6; between buffer block 101h-6 and register block 101h-7; and between buffer block 101h-7 and spare register block 101h-s. Rows r0 to r3 use normal mode routing 11.

Circuitry in vertical register block 102v-5 is also defective. IC portion 1000 is repaired to operate without the defective IO register block by selecting redundant mode routing 12a and 13a as follows: Redundant mode routing 12a routes signals between buffer block 101v-5 and register block 102v-6; between buffer block 101v-6 and register block 102v-7; between buffer block 101v-7 and spare register block 102v-s. Redundant mode routing 13a routes signals between register block 102v-6 and vertical routing interface 103v-5; between register block 102v-7 and vertical routing interface 103v-6; and between spare register block 102v-s and vertical routing interface 103v-7. Columns c0 to c4 use normal mode routing 12 and 13.

Those skilled in the art will appreciate that an integrated circuit in accordance with the present invention may have multiple repairable regions. For example, rows from a spare row up to, but not including, a next spare row may define one repairable region and rows from that next spare row up to yet another spare row may define another repairable region and so forth. Also, it will be appreciated that multiple repairable regions may exist within the IO circuitry of an integrated circuit in accordance with some embodiments of the present invention and that may or may not be dependent on whether a core of the device has a redundancy scheme and associated repairable regions in the core. For example, it will be appreciated that the repair of circuitry in the vertical IO circuitry along the top periphery of portion 1000 of FIGS. 1-2 does not depend on whether redundancy is engaged to shift connections in the core of portion 1000. Moreover, skilled artisans will appreciate that in other embodiments, vertical repairable IO circuitry such as that illustrated in FIGS. 1-2 could be implemented as horizontal repairable 10 circuitry along a right or left periphery (or along an inner column) of an integrated circuit that may or may not have a row-based redundancy scheme. In other words, while some embodiments of the present invention work in coordination with a row-based redundancy scheme in a core of an integrated circuit, other embodiments provide IO circuitry that can be repaired whether or not a core region of the integrated circuit implements a redundancy scheme allowing repair in the core.

Figure 3:
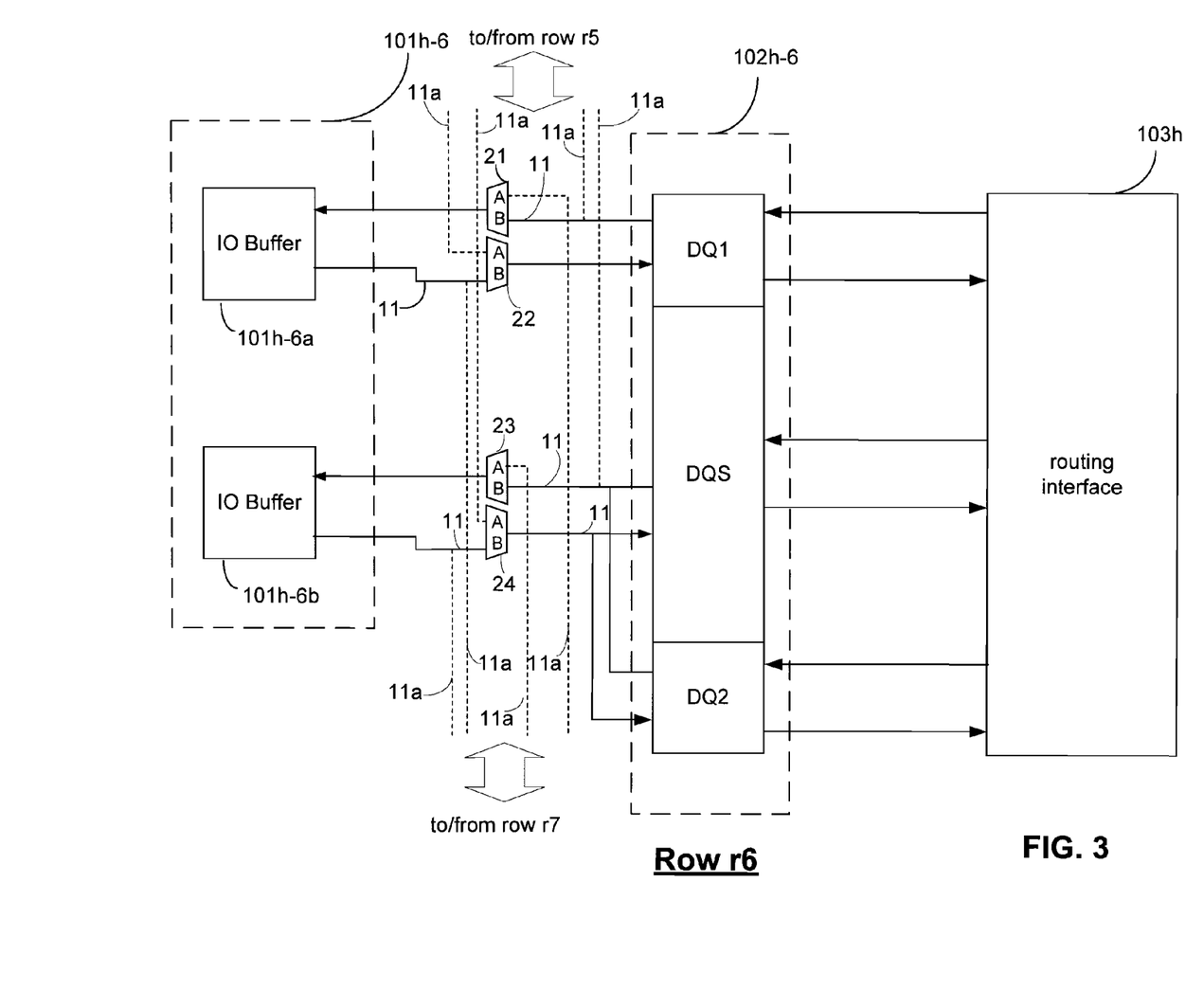
FIG. 3 illustrates the IO circuitry of IC portion 1000 of FIG. 1 associated with row r6 in further detail.

FIG. 3 illustrates the IO circuitry of IC portion 1000 of FIG. 1 associated with row r6 in further detail. As illustrated, IO buffer block 101h-6 includes IO buffer pair circuits 101h-6a and 101h-6b. IO register block 102h-6 includes register circuits DQ1, DQS and DQ2. As will be appreciated by those skilled in the art, in certain data communication protocols, IO register circuits such as DQ1 and DQ2 are typically utilized for data signals and IO register circuits such as DQS are typically utilized for "strobe" signals which may, in some contexts, be used to clock data send and receive operations. Although the terms "DQ" and "DQS" are generally used in the context of certain communication protocols, those terms as used herein will simply be used as labels to identifying IO registers that handle different types of signals ("DQ" relating to data signals and "DQS" relating to signals such as clock signals or other signals that may relate to timing operations). FIG. 3 further illustrates selection circuits 21, 22, 23, and 24 which, in this particular example, are implemented as multiplexer circuits.

In a normal mode (no repair needed), selection circuits 21, 22, 23, and 24 would be configured to select their respective "B" inputs. Thus, IO buffer pair 101h6-a would send signals to and receive signals from IO register circuit DQ1 in register block 102h-6 and IO buffer pair 101h6-b would be able to send signals to and receive signals from IO register circuits DQS and DQ2 in register block 102*h*-6. Although output signals from DQ2 and DQS to multiplexer 23 (and output signals from multiplexer 24 to DQS and DQ2) are shown as being coupled to routing 11, the illustrated implementation would also conventionally include circuitry, such as a multiplexer or such as tri-state drivers, for selecting one of them. For simplicity, such circuitry is not shown in the diagram. In a redundant mode, such as that illustrated for rows r5, r6, r7 and rs in FIG. 2, selection circuits 21, 22, 23, and 24 would be configured to select their respective "A" inputs. In such an example, IO buffer pair 101*h*-6*a* would send signals to and receive signals from an IO register circuit DQ1 in register block 102*h*-7 in row 7 (block 102*h*-7 shown in FIG. 2 but not separately shown in FIG. 3) over redundant mode routing 11*a*. Similarly, IO buffer pair 101*h*-6*b* would be able to send signals to and receive signals from an IO register circuit DQS and an IO register circuit DQ2 in register block 102*h*-7 in row 7. At the same time, data register circuit DQ1 in register block 102*h*-6 would send signals to and receive signals from an IO buffer pair in IO buffer block 101*h*-5 in row 5 (block 101*h*-5 shown in FIG. 2 but not separately shown in FIG. 3) and register circuits DQS and DQ2 in register block 102*h*-6 would be able to send signals to and receive signals from another IO buffer pair in IO buffer block 101*h*-5 in row 5.

Figure 4:
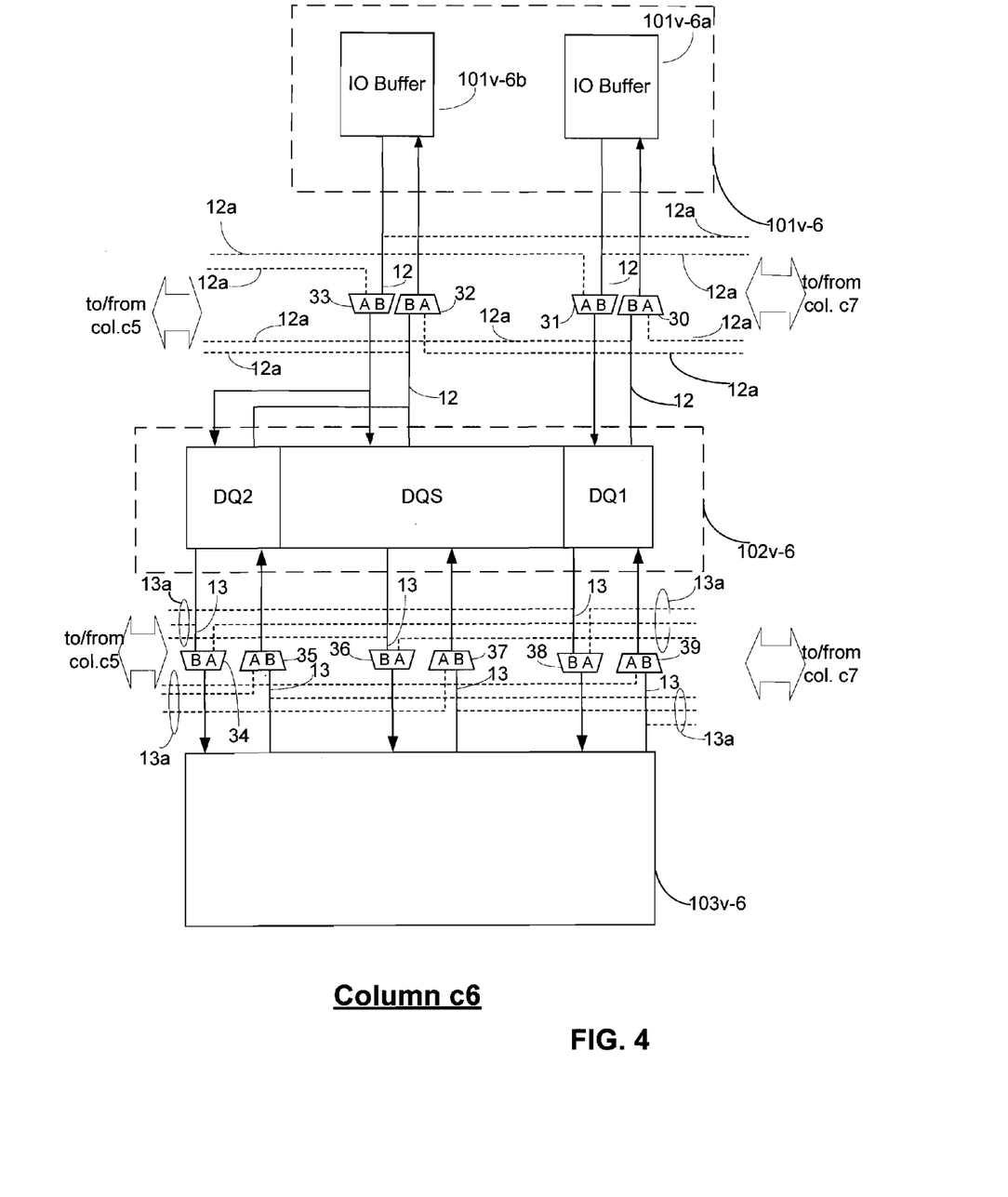
FIG. 4 illustrates the IO circuitry of IC portion 1000 of FIG. 1 associated with column c6 in further detail.

FIG. 4 illustrates the IO circuitry of IC portion 1000 of FIG. 1 associated with column c6 in further detail. As illustrated, IO buffer block 101*v*-6 includes IO buffer pair circuits 101*v*-6*a* and 101*v*-6*b*. IO register block 102*v*-6 includes register circuits DQ1, DQS and DQ2. FIG. 4 further illustrates selection circuits 30, 31, 32, 33, 34, 35, 36, 37, 38, and 39 which, in this particular example, are implemented as multiplexer circuits.

In a normal mode (no repair needed), selection circuits 31, 32, 33, and 34 would be configured to select their respective "B" inputs. Thus, IO buffer pair 101*v*6-*a* would send signals to and receive signals from IO register circuit DQ1 in register block 102*v*-6 and IO buffer pair 101*v*6-*b* would be able to send signals to and receive signals from 10 register circuits DQS and DQ2 in register block 102*v*-6. In this mode, selection circuits 35, 36, 37, 38, and 39 would also be configured to select their "B" inputs. Thus each of register circuits DQ1, DQS, and DQ2 in register block 102*v*-6 would send signals to and receive signals from vertical routing interface 103*v*-6.

In a redundant mode, such as that illustrated for IO registers 102*v*-6, 102*v*-7, and 102*v*-s in FIG. 2, selection circuits 31, 32, 33, and 34 would be configured to select their respective "A" inputs. In such an example, IO buffer pair 101*v*-6*a* would send signals to and receive signals from an IO register circuit DQ1 in register block 102*v*-7 (block 102*v*-7 shown in FIG. 2 but not separately shown in FIG. 4) over redundant mode routing 12*a*. Similarly, IO buffer pair 10*v*-6*b* would be able to send signals to and receive signals from an IO register circuit DQS and an IO register circuit DQ2 in register block 102*v*-7. At the same time, data register circuit DQ1 in register block 102*v*-6 would send signals to and receive signals from an IO buffer pair in IO buffer block 101*v*-5 (block 102*v*-5 shown in FIG. 2 but not separately shown in FIG. 4) and register circuits DQS and DQ2 in register block 102*v*-6 would be able to send signals to and receive signals from another IO buffer pair in IO buffer block 101*v*-5. In this mode, selection circuits 35, 36, 37, 38, and 39 would also be configured to select their "A" inputs. Therefore, register circuits DQ1, DQS, and DQ2 would send signals to and receive signals from vertical routing interface 103*v*-5 (interface 103*v*-5 shown in FIG. 2 but not separately shown in FIG. 4) and vertical routing interface 103*v*-6 would send signals to and receive signals from register circuits in register block 102-*v*7.

Figure 5:
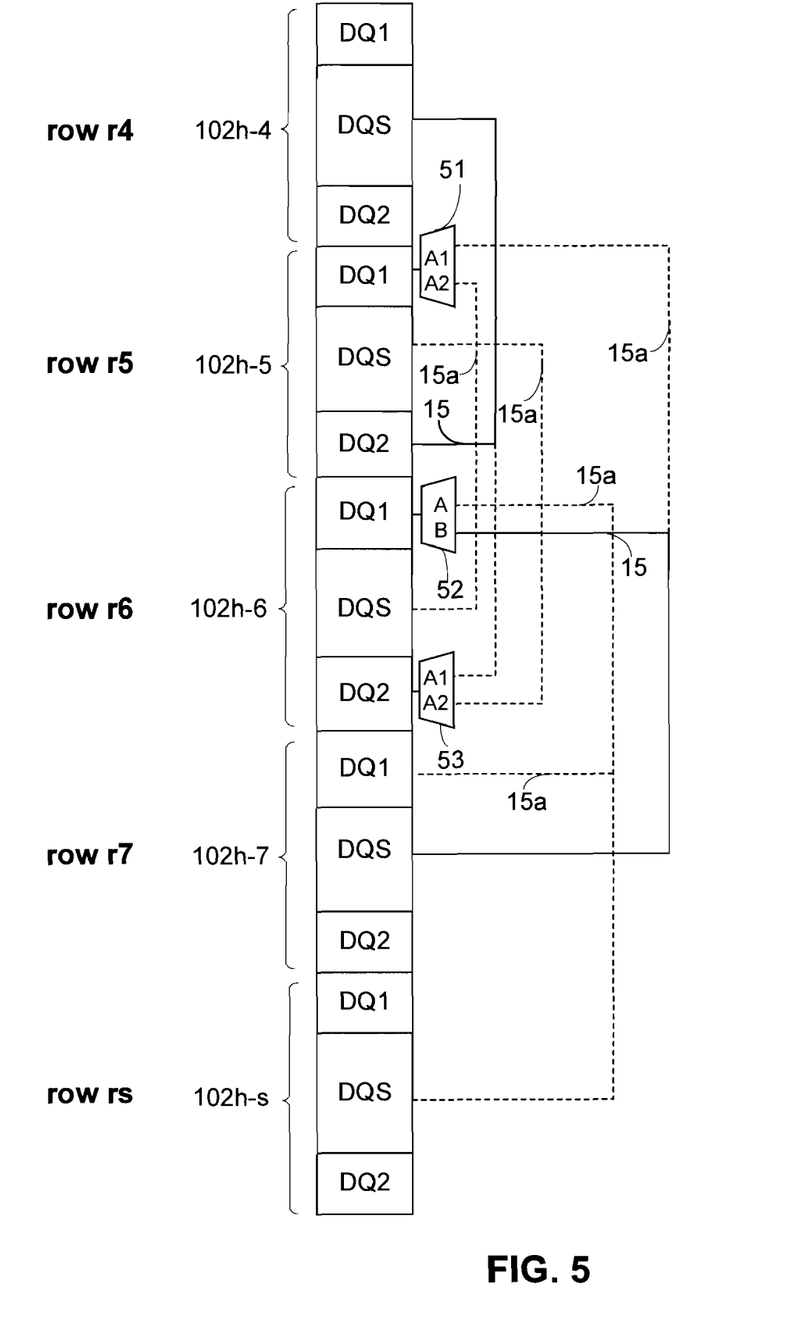
FIG. 5 illustrates repairable connections between IO registers in accordance with another embodiment of the invention.

FIG. 5 illustrates repairable connections between IO registers in accordance with another embodiment of the invention. As illustrated in FIG. 5, some IO register circuits, for example DQS register circuits, may send signals to one or more IO register circuits in other rows. The embodiment illustrated in FIG. 5 provides for redundant connections allowing a shifting of IO register rows that achieves repair with additional redundant connections that provide different routing depending on which row is being repaired.

Specifically, FIG. 5 illustrates further details of certain connections between horizontal IO register blocks 102*h*-4, 102*h*-5, 102*h*-6, 102*h*-7, and 102*h*-s which correspond, respectively, to rows r4, r5, r6, r7, and spare row rs. As illustrated, each IO register block has a DQS register and two data registers, labeled DQ1 and DQ2. FIG. 5 further illustrates selection circuits 51, 52, and 53, normal mode pathways 15 and redundant mode pathways 15*a*.

In a normal mode (no repair needed), routing pathways are configured to make use of the following connections: The DQS register in block 102*h*-4 connects to data register DQ2 in register block 102*h*-5 over a normal mode pathway 15. The DQS register in block 102*h*-6 connects to data register DQ1 in block 102*h*-6 over a normal mode pathway 15 (selection circuit 52 would be configured to select its "B" input).

In a redundant mode, the configured connections would depend on which row is defective. The particular embodiment illustrated provides for two alternate redundant connections for connections that cross a row boundary. For example, if row r4 is defective, then, in the redundant mode, a connection from the DQS register in row r5 (IO register block 102*h*-5) to the data register DQ2 in row r6 (IO register block 102*h*-6) over a redundant mode pathway 15*a* (selection circuit 53 would be configured to select its "A2" input) serves as the connection replacing the normal mode connection from register DQS in row r4 (IO register block 102*h*-4) to data register DQ2 in row r5. Also, since rows would shift down from row r4 to the spare row rs, a connection from the DQS register in spare row rs (IO register block 102*h*-s) to the data register DQ1 in row r7 (IO register block 102*h*-7) over a redundant mode pathway 15*a* serves as the connection replacing the normal mode connection from register DQS in row r7 to the data register DQ1 in row r6.

However, if illustrated rows other than r4 are defective, then, in some instances, different redundant connections than those just described need to be provided and utilized. For example, if row r5 is defective, then, in the redundant mode, a connection from the DQS register in row r4 to the data register DQ2 in row in row r6 over a different redundant mode pathway 15*a* (selection circuit 53 would be configured to select is "A1" input) serves as the connection replacing the normal mode connection from register DQS in row r4 to the data register DQ2 in row r5. As another example, if row r7 is defective, then a connection from the DQS register in spare row rs to the data register DQ1 in row r6 over a different redundant mode pathway 15*a* (selection circuit 52 would be configured to select its "A" input) serves as the connection replacing the normal mode connection from register DQS in row r7 to the data register DQ1 in row r6.

As one skilled in the art will understand, the embodiment of FIG. 5 introduces added complexity to the control of the selection circuits (implemented as multiplexers or "muxes" in the illustrated embodiments). As shown in FIG. 5, even a single DQS connection to a DQ register in another row can create a need for multiple redundant connections. For example, selection circuits 51 and 53 must, in a redundant mode, select between two different DQS signals depending upon which row is defective. It is possible to construct hardwired logic circuitry that adjusts the configuration information for the multiplexers according to which row is defective, but this may entail considerable complexity. However, a relatively simple method to handle this case is to transfer the burden to software. The software that generates the bit stream to program the device can consider all possible cases for each possibility of a defective row, and provide all of these in the bit stream. A PLD implementing this embodiment may be provided with internal information identifying which row is defective, and will only load the appropriate bits.

Those skilled in the art will appreciate that this approach may be cumbersome when the DQS signals span more than one redundancy region because the bit stream needs to contain sufficient information for all combinations of defects in each redundancy region. This can lead to an exponential explosion in the number of bit streams; for example if there are 4 regions each with 25 rows, the bit stream would need to consider $25^4$ or 390,625 possible combinations. Two reasonable solutions to this exist. The first is simply to prohibit DQS signals from spanning more than one redundancy region, which is viable since these signals typically only need to span a relatively small range. The second is to introduce an extra level of redundancy multiplexing between redundancy regions, so that DQS signals between regions will be transmitted on a fixed set of wires, regardless of defects.

Those skilled in the art will also appreciate that the example illustrated in FIG. 5 is simplified in other respects. For example, normal mode connections through selection circuits 51 and 53 may also exist (if, for example the relevant DQ registers receive another DQS signal in a normal mode) but are not separately shown.

Moreover, the principles illustrated in FIG. 5 would also apply to another in which IO registers aligned along a top, bottom, or inner row of the IC had similar routing between IO registers. Specifically, as explained earlier in the context of the circuitry along the top of IC portion 1000 in FIGS. 1-2, IO register blocks may shift to effect IO register block repair (and utilize a spare register block or blocks) consistent with one embodiment of the present invention even if their shift does not correspond to a similar shift of circuitry in a core region to which the IO blocks are connected. This may occur for vertical IO register blocks arranged along a top, bottom, or inner row of an IC that does not employ a column-based redundancy scheme in its core region or regions. It may also occur for horizontal IO register blocks arranged along a right, left, or inner column of an IC that does not employ a row-based redundancy scheme in its core region or regions.

Figure 6:
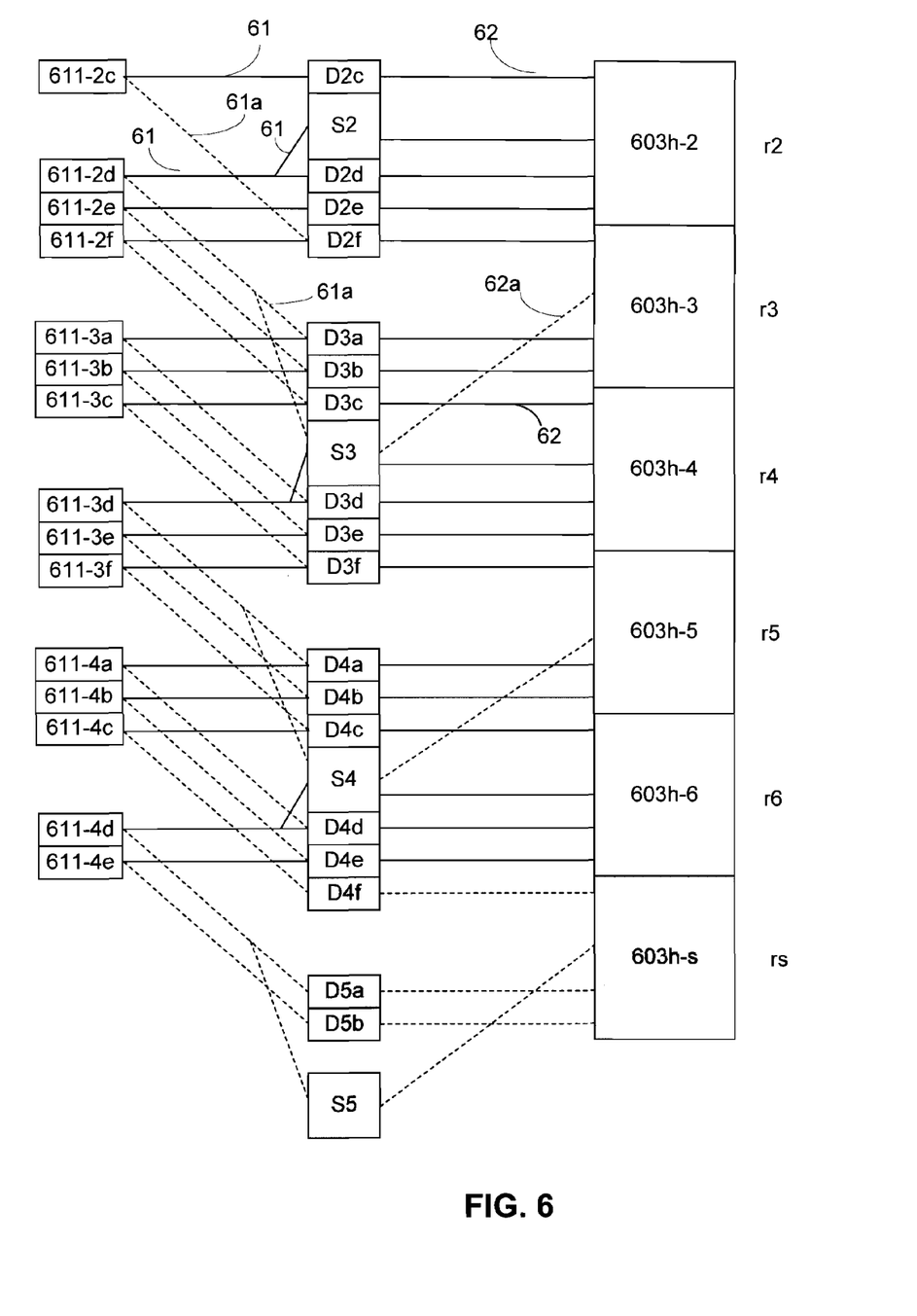
FIG. 6 illustrates another embodiment in accordance with the present invention.

FIG. 6 illustrates another embodiment in accordance with the present invention. FIG. 6 illustrates IO connections corresponding to six rows of an IC including rows r2, r3, r4, r5, r6, and a spare row rs. Routing interfaces corresponding to each row include, respectively, horizontal routing interfaces 603*h*-2, 603*h*-3, 603*h*-4, 603*h*-5, 603*h*-6 and spare horizontal routing interface 603*h*-*s*. Unlike previously illustrated embodiments, in the embodiment of FIG. 6 the rows do not contain the same mix of register types. Specifically, each row contains three DQ type IO blocks, but only alternate rows (r2, r4, and r6) are coupled to a DQS type IO block. Specifically, coupled to row r2, the illustrated embodiment includes DQ register circuits D2*c*, D2*d*, and D2*e* and DQS circuit S2; coupled to row r3, the illustrated embodiment includes DQ registers D2*f*, D3*a*, and D3*b*; coupled to row r4, the illustrated embodiment includes DQ registers D3*c*, D3*d*, and D3*e* and DQS register S3; coupled to row r5, the illustrated embodiment includes DQ registers D3*f*, D4*a*, and D4*b*; coupled to row r6 the illustrated embodiment includes DQ resisters D4*c*, D4*d*, and D4*e* and DQS register S4; and coupled to spare row rs, the illustrated embodiment includes DQ registers D4*f*, D5*a*, and D5*b* and DQS register S5 The illustrated embodiment also includes IO buffer pair circuits 611-2*c*, 611-2*d*, 611-2*e*, 611-2*f*, 611-3*a*, 611-3*b*, 611-3*c*, 611-3*d*, 611-3*e*, 611-3*f* 611-4*a*, 611-4*b*, 611-4*c*, 611-4*d*, and 611-4*e*. The illustrated embodiment also includes normal mode routing pathways 61 and 62 and redundant mode routing pathways 61*a* and 62*a*.

The illustrated arrangement provides a pattern in which some row routing interfaces (in this example, 603*h*-3 for row r3 and 603*h*-5 for row r5) are coupled in a normal mode to three DQ data registers but not to any DQS registers and other row routing interfaces (in this example, 603*h*-2 for row r2, 603*h*-4 for row r4 and 603*h*-6 for row r6) are coupled to three DQ data registers and one DQS register. In other words, in the normal mode, a DQS register is only present in every other row. More generally, at least one type of register is present in some but not all normal mode rows.

Redundancy is handled in the illustrated embodiment by providing redundant mode pathways 61*a* from buffer circuits in one row to IO register circuits (DQ or DQS) in another row and providing additional redundant mode pathways 62*a* from DQS register circuits in one row to a row routing interface in another row. For example, if row r2 is defective, a redundant mode is implemented as follows: selections circuits (selections circuit examples shown in other figures but not separately shown in FIG. 6) are configured to select redundant mode pathways 61*a* (rather than normal mode pathways 61) such that routing is used between the following IO buffer pair circuits and IO register circuits: 611-2*c* and D2*f*; 611-2*d* and D3*a* as well as 611-2*d* and S3; 611-2*e* and D3*b*; 611-2*f* and D3*c*; 611-3*a* and D3*d*; 611-3*b* and D3*e*; 611-3*c* and D3*f*; 611-3*d* and D4*a* as well as 611-3*d* and S4; 611-3*e* and D4*b*; 611-3*f* and D4*c*; 611-4*a* and D4*d*; 611-4*b* and D4*e*; 611-4*c* and D4*f*; 611-4*d* and D5*a* as well as 611-4*d* and S5; and 611-4*e* and D5*b*. In this manner, rows from row r2 (the defective row) to spare row rs shift down such that each row replaces the row above it and spare IO register circuits D4*f*, D5*a*, D5*b*, and S5 are utilized in the redundant mode. Furthermore, because DQS registers do not exist in every row, additional selection circuits (selection circuit examples shown in other figures but not separately shown in FIG. 6) are configured to select redundant mode pathways 62*a* (rather than corresponding normal mode pathways 62) for routing between the following DQS circuits and horizontal row routing interfaces: routing interface 603*h*-3 and DQS register S3; routing interface 603*h*-5 and DQS register S4; and routing interface 603*h*-*s* and DQS register S5. Note that for connections between relevant DQ circuits (e.g. D2*f*, D3*a*, D3*b*, D3*c*, D3*d*, D3*f*, D4*a*, D4*b*, D4*c*, D4*d*, and D4*e*) and corresponding row routing interfaces (e.g. row routing 603*h*-3, 603*h*-4, 603*h*-5, and 603*h*-6) the same pathways 61 are used in normal and redundant modes because the pattern of DQ circuits is the same from row to row (each row has three). It is only the pattern of DQS circuits that changes from row to row, thus necessitating extra selection circuitry and redundant mode pathways between DQS circuits and row routing interfaces.

In an alternative embodiment, spare IO register circuits may be provided that are effectively two rows high, thus allowing the IO registers to shift down by two rows to achieve repair and maintaining the pattern of DQ and DQS registers from row to row. However, such an embodiment would require additional selection circuits and redundant mode pathways to shift both DQS and DQ connections to row routing interfaces up to the relevant corresponding row.

Although such an alternative might be conceptually simpler, it would require more routing resources than does the embodiment illustrated in FIG. 6.

Although some embodiments of the present invention are described in the context of a programmable logic device having a row-based redundancy scheme (in which "horizontal" routing routes generally in the direction of the row and "vertical" routing is generally oriented to span multiple rows and/or route in the direction of a column), the invention is equally applicable to programmable logic devices using column-based redundancy schemes. Because the terminology of rows and columns is relative to the orientation of the device, in a typical device having rows and columns perpendicular to each other, one may interchange the words row and column by merely rotating a device 90 degrees.

Furthermore, although the terms "row" and "column" are typically associated with a straight-line arrangement of items, alternative embodiments may employ row or column arrangements that are curved, or partially curved, or that have occasional jogs or gaps, or that do not span an entire region of an IC without necessarily departing from the spirit and scope of the present invention. Devices including such rows of varying orientation may still have a redundancy scheme that is within the scope of the present invention. Moreover, some embodiments of the present invention provide IO redundancy for repair of IO circuitry in the periphery (or in an inner IO region) even if the core logic region or regions of the device do not have a row-based (or column-based) redundancy scheme.

Figure 7:
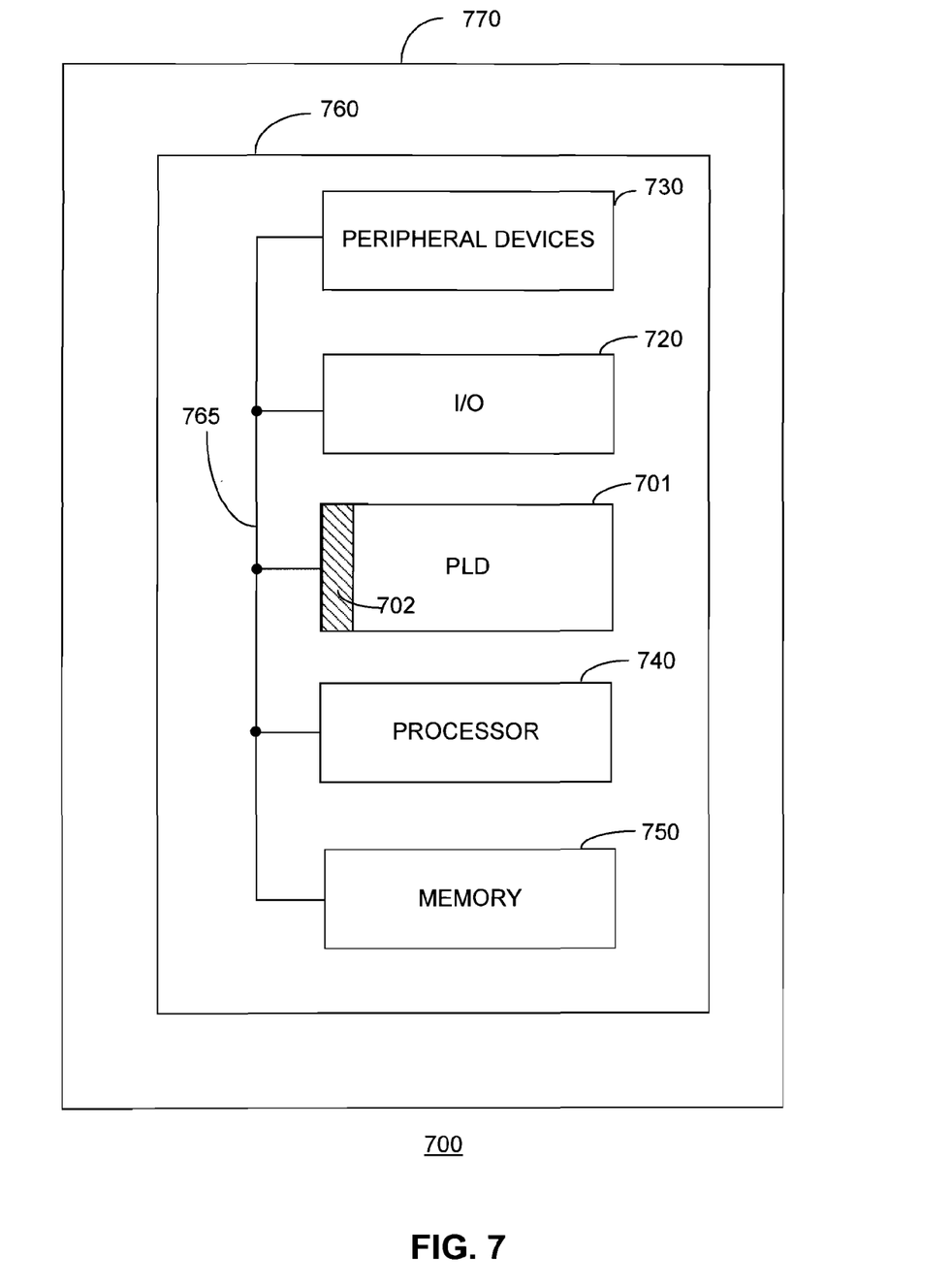
FIG. 7 illustrates an exemplary data processing system including a programmable logic device with repairable IO circuitry in accordance with an embodiment of the present invention.

FIG. 7 illustrates an exemplary data processing system 700 including PLD 701 with repairable IO circuitry in accordance with an embodiment of the present invention. PLD 701 includes at least one peripheral IO region 702 that includes at least some repairable IO circuitry. For ease of illustration, only a single peripheral IO region with repairable IO circuitry is shown; however, a PLD such as PLD 701 may have additional repairable IO regions, for example, on a left, top, and/or bottom periphery or inner IO row and/or IO column of the device.

Data processing system 700 may include one or more of the following additional components: processor 740, memory 750, input/output (I/O) circuitry 720, and peripheral devices 730 and/or other components. These components are coupled together by system bus 765 and are populated on circuit board 760 which is contained in end-user system 770. A data processing system such as system 700 may include a single end-user system such as end-user system 770 or may include a plurality of systems working together as a data processing system.

System 700 can be used in a wide variety of applications, such as computer networking, data networking, instrumentation, video processing, digital signal processing, or any other application where the advantage of using programmable or reprogrammable logic in system design is desirable. PLD 701 can be used to perform a variety of different logic functions. For example, PLD 701 can be configured as a processor or controller that works in cooperation with processor 740 (or, in alternative embodiments, a PLD might itself act as the sole system processor). PLD 701 may also be used as an arbiter for arbitrating access to shared resources in system 700. In yet another example, PLD 701 can be configured as an interface between processor 740 and one of the other components in system 700. It should be noted that system 700 is only exemplary.

In one embodiment, system 700 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but only by the following claims.

The invention claimed is:

1. An integrated circuit ("IC") comprising:
   a plurality of input/output ("IO") buffer circuits;
   a plurality of IO register circuits;
   normal mode routing including routing operable to couple IO buffer circuits of the plurality of IO buffer circuits to IO register circuits of the plurality of IO register circuits and routing operable to couple IO register circuits of the plurality of IO register circuits to core routing of the IC; and
   redundant mode routing including routing operable to couple IO buffer circuits of the plurality of IO buffer circuits to IO register circuits of the plurality of IO register circuits and routing operable to couple IO register circuits of the plurality of IO register circuits to core routing of the IC;
   wherein the IC is configurable to utilize either the normal mode routing or the redundant mode routing, the redundant mode routing including at least some routing that is different than the normal mode routing.

2. The IC of claim 1 wherein the plurality of IO register circuits includes a spare IO register circuit and the redundant mode routing includes routing operable to couple an IO buffer circuit of the plurality of IO buffer circuits to the spare IO register circuit and routing operable to couple the spare IO register circuit to core routing of the IC.

3. The IC of claim 1 further including selection circuits configurable to select between the normal mode routing and the redundant mode routing.

4. The IC of claim 1 wherein the IC includes circuitry arranged in rows and the IC is operable to shift rows from a defective row to a spare row and bypass circuitry in the defective row.

5. The IC of claim 1 wherein the normal mode routing further includes routing operable to couple a first IO register circuit to a second IO register circuit and the redundant mode routing includes routing operable to couple the first IO register circuit to a third IO register circuit.

6. An integrated circuit ("IC") comprising:
   a plurality of input/output ("IO") register circuits coupled to rows of the IC;
   normal mode routing operable to couple two or more IO register circuits of the plurality of IO register circuits that are in different rows of the IC; and
   redundant mode routing operable to couple two or more IO register circuits of the plurality of IO register circuits that are in different rows of the IC;
   wherein the redundant mode routing is arranged such that the IC is operable in a redundant mode to shift rows from a bypassed row to a spare row and a redundant mode connection between two or more IO register circuits that are in different rows of the IC is operable to replace a normal mode connection between two or more IO register circuits that are in different rows of IC.

7. The IC of claim 6 wherein redundant mode routing is coupled between IO registers in different rows such that alternate redundant mode connections are provided and the alternate redundant mode connections are selectable depending on which IC row is bypassed in a redundant mode.

8. An integrated circuit ("IC") comprising:
a plurality of IO register circuits including register circuits operable to be designated as DQ register circuits and including register circuits operable to be designated as DQS register circuits;
normal mode routing operable to couple the plurality of IO register circuits to row routing of the IC such that designated DQS register circuits are coupled in a normal mode of the IC to some but not all rows of the IC; and
redundant mode routing operable to couple the plurality of IO register circuits to row routing of the IC wherein a row not operable to receive signals from a designated DQS register circuit in a normal mode of the IC is operable to receive signals from the designated DQS register circuit in a redundant mode of the IC.

9. The IC of claim 8 further comprising:
a plurality of IO buffer circuits;
additional normal mode routing operable to couple the plurality of IO buffer circuits to the plurality of IO register circuits;
additional redundant mode routing operable to couple the plurality of IO buffer circuits to the plurality of IO register circuits, the additional redundant mode routing including at least some routing that is different than the additional normal mode routing.

10. The IC of claim 9 wherein:
the additional normal mode routing includes routing operable to couple a first IO buffer circuit to a first designated DQ register circuit and to a first designated DQS register circuit; and
the additional redundant mode routing includes routing operable to couple the first IO buffer circuit to a second designated DQ register circuit and to a second designated DQS register circuit.

11. The IC of claim 8 wherein the IC is operable in a redundant mode to shift rows from a defective row to a spare row to bypass circuitry in the defective row.

12. An integrated circuit ("IC") comprising:
a plurality of IO register circuits;
normal mode routing operable to couple the plurality of IO register circuits to row routing of the IC; and
redundant mode routing operable to couple the plurality of IO register circuits to row routing of the IC;
wherein a pattern of designated types of IO register circuits coupled to row routing of the IC varies from row to row and either the normal mode routing or the redundant mode routing is selectable for operation of the IC and wherein redundant mode routing is operable to couple at least one designated type of IO register circuit to a different row than a row to which the normal mode routing is operable to couple that designated type of IO register circuit.

13. An integrated circuit ("IC") comprising:
a plurality of IO register circuits;
normal mode routing operable to couple the plurality of IO register circuits to row routing of the IC; and
redundant mode routing operable to couple the plurality of IO register circuits to row routing of the IC;
wherein a pattern of designated types of IO register circuits coupled to row routing of the IC varies from row to row and either the normal mode routing or the redundant mode routing is selectable for operation of the IC and wherein the plurality of IO register circuits includes more than one row of spare IO register circuits and the redundant mode routing is operable to couple the IO register circuits to the row routing of the IC such that the IC is configurable to shift connections in a redundant mode by more than one row to maintain the pattern of designated types of IO register circuits from row to row.

* * * * *